(12) United States Patent
Sanfilippo et al.

(10) Patent No.: US 8,574,945 B2
(45) Date of Patent: **\*Nov. 5, 2013**

(54) ARRAY OF MUTUALLY INSULATED GEIGER-MODE AVALANCHE PHOTODIODES, AND CORRESPONDING MANUFACTURING PROCESS

(75) Inventors: Delfo Nunziato Sanfilippo, Catania (IT); Emilio Antonio Sciacca, Catania (IT); Piero Giorgio Fallica, Catania (IT); Salvatore Antonio Lombardo, Catania (IT)

(73) Assignee: STMicroelectronics S.r.l., Agrate Brianza (IT)

( \* ) Notice: Subject to any disclaimer, the term of this patent is extended or adjusted under 35 U.S.C. 154(b) by 25 days.

This patent is subject to a terminal disclaimer.

(21) Appl. No.: 13/241,114

(22) Filed: Sep. 22, 2011

(65) Prior Publication Data

US 2012/0009722 A1    Jan. 12, 2012

Related U.S. Application Data

(62) Division of application No. 12/356,464, filed on Jan. 20, 2009, now Pat. No. 8,471,293.

(30) Foreign Application Priority Data

Jan. 18, 2008  (IT) .............................. TO2008A0045

(51) Int. Cl.
*H01L 21/76* (2006.01)
(52) U.S. Cl.
USPC ............. 438/57; 438/414; 438/424; 257/414; 257/428; 257/431; 257/438; 257/443; 257/446; 257/461; 257/E21.357; 257/E31.116; 257/E29.335; 257/E31.001; 257/E31.11

(58) Field of Classification Search
None
See application file for complete search history.

(56) References Cited

U.S. PATENT DOCUMENTS

| 4,313,127 A | 1/1982 | Su et al. |
| 4,972,244 A | 11/1990 | Buffet et al. |

(Continued)

FOREIGN PATENT DOCUMENTS

| DE | 102007037020 | 8/2008 |
| EP | 1596439 | 11/2005 |

(Continued)

OTHER PUBLICATIONS

Search Report Based on Italian Patent Application Serial No. TO20080945, Ministero Dello Sviluppo Economico, Munich, Nov. 4, 2009, 2 Pages.

(Continued)

*Primary Examiner* — Fei Fei Yeung Lopez
(74) *Attorney, Agent, or Firm* — Graybeal Jackson LLP

(57) ABSTRACT

An embodiment of an array of Geiger-mode avalanche photodiodes, wherein each photodiode is formed by a body of semiconductor material, having a first conductivity type, housing a first cathode region, of the second conductivity type, and facing a surface of the body, an anode region, having the first conductivity type and a higher doping level than the body, extending inside the body, and facing the surface laterally to the first cathode region and at a distance therefrom, and an insulation region extending through the body and insulating an active area from the rest of the body, the active area housing the first cathode region and the anode region. The insulation region is formed by a mirror region of metal material, a channel-stopper region having the second conductivity type, surrounding the mirror region, and a coating region, of dielectric material, arranged between the mirror region and the channel-stopper region.

16 Claims, 7 Drawing Sheets

(56) References Cited

U.S. PATENT DOCUMENTS

| | | | |
|---|---|---|---|
| 5,360,987 | A | 11/1994 | Shibib |
| 5,367,188 | A | 11/1994 | Kudo |
| 5,501,893 | A | 3/1996 | Laermer et al. |
| 5,596,186 | A | 1/1997 | Kobayashi |
| 6,118,142 | A | 9/2000 | Chen et al. |
| 6,437,415 | B1 | 8/2002 | Kuhara et al. |
| 6,541,836 | B2 | 4/2003 | Iwanczyk et al. |
| 6,551,904 | B2 | 4/2003 | Kawahara |
| 6,693,337 | B2 | 2/2004 | Yoneda et al. |
| 6,949,445 | B2 | 9/2005 | Rhodes et al. |
| 6,995,444 | B2 | 2/2006 | Cova et al. |
| 2001/0017786 | A1 | 8/2001 | Woodward |
| 2002/0139970 | A1 | 10/2002 | Iwanczyk et al. |
| 2007/0020791 | A1 | 1/2007 | Hsu et al. |
| 2007/0045767 | A1 | 3/2007 | Zhu et al. |
| 2008/0121988 | A1 | 5/2008 | Mallikararjunaswamy et al. |
| 2008/0157150 | A1* | 7/2008 | Shim ............................ 257/292 |
| 2008/0191238 | A1 | 8/2008 | Madathil et al. |
| 2008/0308738 | A1* | 12/2008 | Li et al. ................... 250/370.11 |
| 2008/0315248 | A1 | 12/2008 | Tokura et al. |
| 2009/0032896 | A1 | 2/2009 | Taniguchi et al. |
| 2009/0057757 | A1 | 3/2009 | Hokomoto et al. |
| 2009/0065826 | A1 | 3/2009 | Hwang |
| 2009/0184317 | A1* | 7/2009 | Sanfilippo et al. .............. 257/49 |
| 2009/0184384 | A1 | 7/2009 | Sanfilippo et al. |
| 2010/0127314 | A1 | 5/2010 | Finch |
| 2010/0148040 | A1 | 6/2010 | Sanfilippo et al. |
| 2010/0271108 | A1 | 10/2010 | Sanfilippo et al. |
| 2011/0095388 | A1 | 4/2011 | Richter et al. |

FOREIGN PATENT DOCUMENTS

| | | |
|---|---|---|
| EP | 1744366 | 1/2007 |
| EP | 1755171 | 2/2007 |
| RU | 2102821 | 1/1998 |
| WO | 2007108456 A1 | 9/2007 |
| WO | 2008129433 | 10/2008 |

OTHER PUBLICATIONS

Cova et al. (Apr. 20, 1996) "Avalanche Photodiodes and Quenching Circuits for Single-Photon Detection"; Applied Optics; 35(12):1956-1976.

Dolgoshein et al. (2006) "Status Report on Silicon Photomultiplier Development and Its Applications"; Nuclear Instruments and Methods in Physics Research; A 563: 368-376.

Piemonte (2006) "A New Silicon Photomultiplier Structure for Blue Light Detection"; Nuclear Instruments and Methods in Physics Research; A 568: 224-232.

Sadygov et al. (2006) "Three Advanced Designs of Micro-Pixel Avalanche Photodiodes: Their Present Status, Maximum Possibilities and Limitations"; Nuclear Instruments and Methods in Physics Research; A 567: 70-73.

Kindt et al. (1997) "A Silicon Avalanche Photodiode for Single Optical Photon Counting in the Geiger Mode"; Sensor and Actuators A; 60:98-102.

Renker (2006) "Geiger-Mode Avalanche Photodiodes, History, Properties and Problems"; Nuclear Instruments and Methods in Physics Research; A 567:48-56.

Sciacca et al. (Apr. 2003) "Silicon Planar Technology for Single-Photon Optical Detectors"; IEEE Transactions on Electron Devices; 50(4):918-925.

Buzhan et al. (2003) "Silicon Photomultiplier and Its Possible Applications"; Nuclear Instruments and Methods in Physics Research; A 504: 48-52.

Ghioni et al. (Jul./Aug. 2007) "Progress in Silicon Single-Photon Avalanche Diodes"; IEEE Journal of Selected Topics in Quantum Electronics; 13(4):852-862.

Sciacca et al. (Aug. 1, 2006) "Arrays of Geiger Mode Avalanche Photodiodes"; IEEE Photonics Technology Letters; 18(15):1633-1635.

Jackson et al. (Jan. 2003) "Towards Integrated Single Photon Counting Microarrays"; Optical Engineering; 42(1):112-118.

Niclass et al. (Sep. 2005) "Design and Characterization of a CMOS 3-D Image Sensor Based on Single Photon Avalanche Diodes"; IEEE Journal of Solid-State Circuits; 40(9):1847-1854.

Zappa et al. (Mar. 2005) "SPADA: Single-Photon Avalanche Diode Arrays"; IEEE Photonics Technology Letters; 17(3):657-659.

Aull et al. (2002) "Geiger-Mode Avalanche Photodiodes for Three-Dimensional Imaging"; Lincoln Laboratory Journal; 13(2):335-350.

Renker (2002) "Properties of Avalanche Photodiodes for Applications in High Energy Physics, Astrophysics and Medical Imaging"; Nuclear Instruments and Methods in Physics Research; A 486:164-169.

Vasile et al. (Jun. 1998) "Photon Detection With High Avalanche Photodiode Arrays"; IEEE Transactions on Nuclear Science; 45(3):720-723.

U.S. Appl. No. 12/637,628, filed Dec. 14, 2009, "Geiger-Mode Photodiode With Integrated and Adjustable Quenching Resistor, Photodiode Array, and Manufacturing Method Thereof".

Campisi et al. (2007) "Multipixel Geiger-Mode Photon Detectors for Ultra-Weak Light Sources"; Nuclear Instruments and Methods in Physics Research; A 571:350-354.

Mazzillo et al. (Dec. 2008) "Quantum Detection Efficiency in Geiger Mode Avalanche Photodiodes"; IEEE Transactions on Nuclear Science; 55(6):3620-3625.

Zappa et al. (2007) "Principles and Features of Single-Photon Avalanche Diode Arrays"; Sensors and Actuators; A 140: 103-112.

Mazzillo et al. (2007) "Single Photon Avalanche Photodiodes Arrays"; Sensors and Actuators; A 138:306-312.

Shimakura et al. (1975) "Boron and Phosphorus Diffusion Through an SiO2, Layer From a Doped Polycrystalline Si Source Under Various Drive-in Ambients"; Solid-State Electronics; 18:991-997.

Search Report for Italian Patent Application No. TO20100251, Ministero Dello Sviluppo Economico, Dated Nov. 12, 2010; 3 Pages.

Search Report for Italian Patent Application No. ITTO20090322, Ministero Dello Sviluppo Economico, Dated Nov. 6, 2009; 2 Pages.

U.S. Appl. No. 13/070,876, filed Mar. 24, 2011; "Geiger-Mode Avalanche Photodiode With High Signal-to-Noise Ratio, and Corresponding Manufacturing Process".

\* cited by examiner

ARRAY OF MUTUALLY INSULATED GEIGER-MODE AVALANCHE PHOTODIODES, AND CORRESPONDING MANUFACTURING PROCESS

PRIORITY CLAIM

The present application is a Divisional of U.S. patent application Ser. No. 12/356,464, filed Jan. 20, 2009, currently pending; which application claims the benefit of Italian Patent Application Serial No.: TO2008A000045, filed Jan. 18, 2008; all of the foregoing applications are incorporated herein by reference in their entireties.

RELATED APPLICATION DATA

This application is related to the U.S. patent application Ser. No.: 12/356,445 entitled ARRAY OF MUTUALLY ISOLATED, GEIGER-MODE, AVALANCHE PHOTODIODES AND MANUFACTURING METHOD THEREOF, filed Jan. 20, 2009 and which is incorporated herein in its entirety. The present application is also related to U.S. patent application Ser. No.: 12/637,628, entitled GEIGER-MODE PHOTODIODE WITH INTEGRATED AND ADJUSTABLE QUENCHING RESISTOR, PHOTODIODE ARRAY, AND MANUFACTURING METHOD THEREOF, filed Dec. 14, 2009; U.S. patent application Ser. No.: 12/764,888, entitled GEIGER-MODE PHOTODIODE WITH INTEGRATED AND JFET-EFFECT-ADUSTABLE QUENCHING RESISTOR, PHOTODIODE ARRAY, AND CORRESPONDING MANUFACTURING METHOD, FILED Apr. 21, 2010; and U.S. patent application Ser. No.: 13/070,876, entitled GEIGER-MODE AVALANCHE PHOTODIODE WITH HIGH SIGNAL-TO-NOISE RATIO, AND CORRESPONDING MANUFACTURING PROCESS, filed Mar. 24, 2011.

TECHNICAL FIELD

An embodiment relates to an array of mutually insulated Geiger-mode avalanche photodiodes, and to the corresponding manufacturing process.

BACKGROUND

In the technical field of photon detection, the counting and detection of individual photons is assuming an ever-increasing importance.

In molecular biology, for example, the detection of molecules is performed using fluorescence or luminescence phenomena, frequently characterized by extremely reduced light emission.

Extremely sensitive sensors are moreover required in the digital capture of three-dimensional images in reduced lighting conditions.

To this end, Geiger-mode avalanche photodiodes find a wide range of uses in so far as their high quantum efficiency allows detection of both individual photons and packets of photons.

Unlike a PN-junction photodiode, a Geiger-mode avalanche photodiode operates at a reverse biasing voltage that is higher than the breakdown voltage.

The sensitivity to incident photons and, hence, the likelihood of detection depend upon the reverse biasing voltage of the photodiode. In particular, the greater the reverse biasing voltage, beyond the breakdown threshold, the greater the likelihood of an avalanche generation of charge carriers occurring.

In this condition and in the absence of incident photons, an individual charge carrier generated in conditions of darkness, for example by transfer of thermal energy, is sufficient to trigger the process of avalanche carrier generation by impact ionization, generating a flow of current referred to as "dark current".

The dark current is an undesirable effect in this type of devices in so far as it generates an electrical signal even in the absence of incident photons and may adversely interfere with the normal use of the device.

In addition, Geiger-mode avalanche photodiodes belonging to an array of photodiodes are extremely sensitive not only to the photons that impinge thereon, but also to charge carriers (for example, electrons) generated by the adjacent photodiodes sharing the same substrate and to photons generated by electroluminescence during the avalanche multiplication in adjacent photodiodes. These effects are known, respectively, as "electrical cross-talk" and "optical cross-talk".

In order to exploit fully the sensitivity of the Geiger photodiode for detection of individual photons and to reduce the negative effect of electrical and optical cross-talk, the active regions of said photodiodes are typically made such that the crystal lattice has an extremely small number of defects. In this condition, a carrier generated in dark conditions statistically traverses a long mean free path before generating an avalanche effect through an impact-ionization mechanism.

The above solution does not, however, reduce the sensitivity of the array. In fact, in the time interval corresponding to the free path, which is relatively long, of a charge carrier, an incident photon may generate an electron-hole pair, which triggers the process of avalanche generation, thus causing a flow of current associated with the incident photon, which enables detection thereof.

Since the process of avalanche generation is self-sustaining, it is moreover necessary to implement a circuit for quenching the avalanche effect and resetting the photodiode so as to render it available for detection of a further photon. Currently known quenching circuits are of two types: active ones and passive ones.

In the passive-quenching mode, a resistor having a high resistance is set in series to the photodiode. A photon impinging upon the photodiode determines an increase of current in the photodiode and in the series-connected resistor, causing a voltage drop that reduces the electrical field that sustains the avalanche carrier generation to a value lower than that of the breakdown voltage. Consequently, the avalanche carrier generation is interrupted.

In the active-quenching mode, a purposely designed external circuit detects the increase of current caused by an impinging photon and reduces the voltage on the photodiode below the breakdown threshold using a switch that couples the photodiode to a resistor having a high resistance and operating analogously to the described passive mode. In both the passive and the active modes, at the end of the photodiode-current resetting, the reverse voltage applied thereto again reaches a high value, higher than the breakdown voltage.

Getting back to the problem of optical and/or electrical cross-talk, some solutions have been proposed.

According to a first solution proposed for the reduction of optical cross-talk, each photodiode is insulated from adjacent photodiodes by metal trenches having the function of mirroring the photons responsible for optical cross-talk; this solution is typically ineffective as regards electrical cross-talk.

According to a second solution, aimed at eliminating both optical and electrical cross-talk, each photodiode will be insulated from the adjacent photodiodes by V-shaped grooves. This approach, however, drastically reduces the possibility of high integration of the components on account of the considerable area occupied by the V-shaped grooves.

According to a third solution, which is also suitable for eliminating both types of cross-talk, the individual photodiodes are provided in separate dies assembled mechanically within a same package. In this solution, the photodiodes do not share their own substrate with the adjacent photodiodes, and a total insulation is obtained both from the optical and the electrical standpoint. Also the latter solution has the disadvantage of not enabling a high level of integration of the components and has high production costs.

SUMMARY

An embodiment includes an array of avalanche photodiodes that enables a reduction of the optical and electrical cross-talk together with a high level of integration on a same die.

BRIEF DESCRIPTION OF THE DRAWINGS

For a better understanding of the subject matter, embodiments thereof are now described, purely by way of non-limiting example and with reference to the attached drawings.

DETAILED DESCRIPTION

Figure 1:
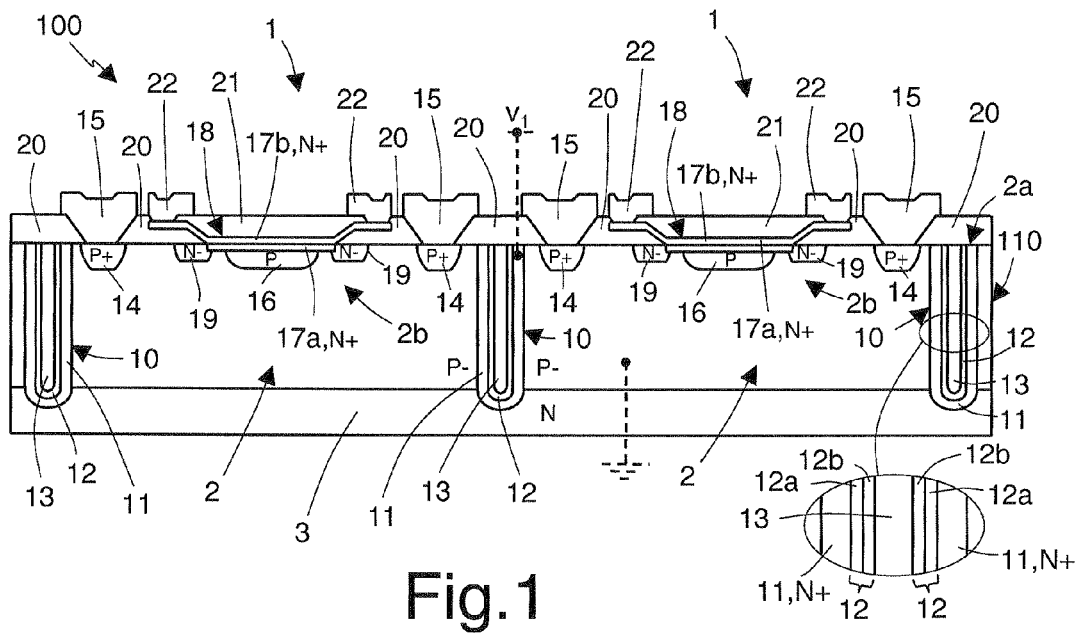
FIG. 1 is a cross-section of a first embodiment of an array of photodiodes.
Figure 2:
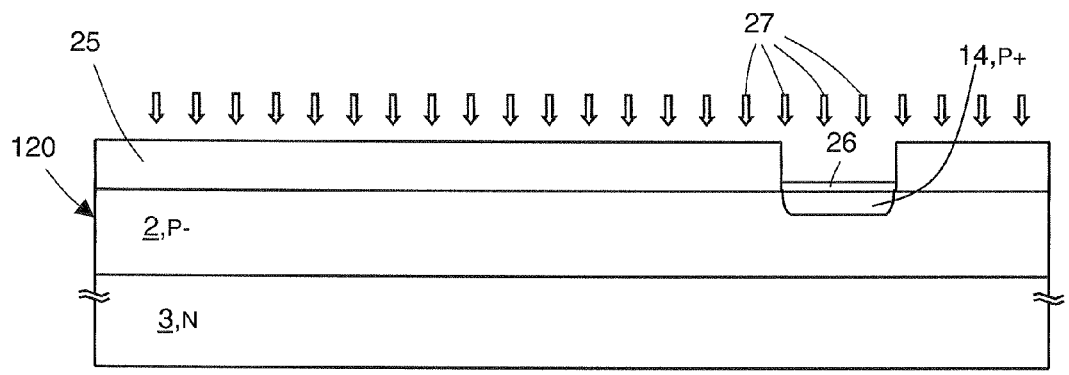
FIGS. 2-9 are cross-sections of a photodiode belonging to the array of FIG. 1 in successive manufacturing steps.
Figure 3:
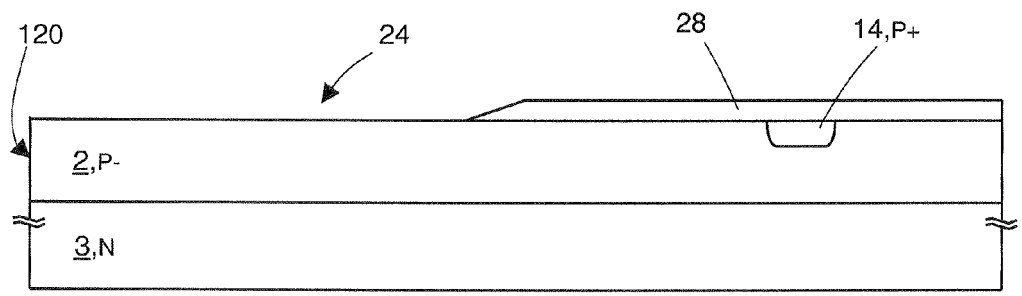

FIG. 1 shows an embodiment of an array 100 of Geiger photodiodes of a planar type. In the figure, two photodiodes 1 are shown. The array 100 may, however, comprise any number of photodiodes according to the application.

The array 100 is integrated in a chip 110 including an epitaxial layer 2 of a P− type having a surface 2a and overlying a substrate 3, of an N type, for example of a float-zone type. This type of substrate may be characterized by a high level of purity, for reducing the presence of sites where the avalanche-carrier generation in dark conditions occurs.

A deep lateral insulation region 10 having, for example, a circular or polygonal shape, extends vertically through the epitaxial layer 2 and part of the substrate 3 so as to delimit and insulate portions 2b of the epitaxial layer, each forming an active region housing a single photodiode 1. In practice, each photodiode 1 is insulated from the adjacent photodiodes 1 by the lateral insulation region 10.

As is shown by the enlarged detail, the lateral insulation region 10 comprises a channel-stopper region 11, of an N+type for example doped with phosphorus, arranged externally and in direct contact with the epitaxial layer 2 and the substrate 3; a coating region 12, for example of oxide, extending inside the channel-stopper region 11; and a mirror region 13, for example of metal, for example tungsten, surrounded by the coating region 12 and filling the lateral insulation region 10.

In practice, the channel-stopper region 11 forms, together with the epitaxial layer 2 and the substrate 3, a PN junction, which, on account of the built-in field that is naturally set up at the junction interface, inhibits the passage of electrons between the active areas 2b of adjacent photodiodes 1. Furthermore, the P-N junction formed by the epitaxial layer 2 and the channel-stopper region 11 may be reverse-biased. In particular, the channel-stopper region 11, of N+ type, may be biased at a voltage $V_1$ of, for example, 5 V, higher than the epitaxial layer 2, of N type, which may be grounded, as represented schematically in FIG. 1.

The coating region 12 has the function of improving the electrical insulation between adjacent photodiodes, while the mirror region 13 has the function of inhibiting the passage of photons.

In order to improve the insulation, the coating region 12 may be formed by a double layer: a thinner outer coating layer 12a, for example of thermal oxide of a thickness of between approximately 100 and 200 nm, arranged more externally, and a thicker inner coating layer 12b, for example of TEOS oxide of a thickness of approximately between 100 and 200 nm, arranged more internally.

In each active area 2b, an anode region 14, of a closed, for example circular, shape and of a P+ type, faces the top surface 2a. The anode region 14 is in direct electrical contact with an anode metal region 15 and has the function of reducing the contact resistance and creating a low-resistance path for the reverse photodiode current. An enriched region 16 of a P type extends in the epitaxial layer 2, surrounded at a distance by the anode region 14. A bottom cathode region 17a, of an N+ type, extends in the epitaxial layer 2, on top of the enriched region 16, and faces the surface 2a. The bottom cathode region 17a is in contact with a top cathode region 17b, of polycrystalline silicon of an N+ type. The bottom cathode region 17a and the top cathode region 17b form a cathode 18.

A guard ring 19 of a closed, for example circular, shape and of an N-type extends in the epitaxial layer 2, on the outside of and contiguous with the bottom cathode region 17a but surrounded at a distance by the anode region 14. The guard ring 19, which faces the surface 2a, forms a PN diode with the epitaxial layer 2 so as to prevent edge breakdown of the enriched region 16.

The top cathode region 17b may be non-planar and has a peripheral edge (approximately overlying the guard ring 19), which extends over an insulation layer 20, for example of SOG (spun-on-glass) TEOS (tetraethyl orthosilicate) oxide, which coats the entire active area 2b except at a peripheral portion, where a cathode metal region 22 is in electrical contact with the top cathode region 17b, except for a peripheral portion, where the cathode metal region 22 is in electrical contact with the top cathode region 17b.

In a way not shown, the cathode metal region 22 is coupled to a quenching resistor, which can be made according to any known technique, for example, as a diffused resistor in the epitaxial layer, inside and outside of the active area 2b of the respective photodiode 1, or as polysilicon resistor, arranged above the insulation layer 20. Alternatively, the quenching resistor can be made from the same polycrystalline region forming the top cathode region 17b or from a polycrystalline region directly in contact with the top cathode region 17b, as described hereinafter with reference to FIGS. 14 and 15.

The photodiode 1 of FIG. 1 thus enables the flow of charged particles and photons generated by electroluminescence inside the epitaxial layer, to and from adjacent photodiodes 1, to be interrupted. In fact, the PN junction formed by the channel-stopper region 11 and the epitaxial layer 2 blocks the electrical charges, whereas the mirror region 13 blocks the photons. The efficiency of blocking of the electrical particles is further improved by the presence of the coating region 12, as indicated above.

The photodiodes 1 of FIG. 1 are obtained using the process described hereinafter and represented in FIGS. 2-9, only as regards half of the photodiode 1, it being understood that the other half is formed in a similar manner.

Initially (FIG. 2), an epitaxial layer 2 with a P− type doping is grown on a float-zone substrate 3, of an N type, to obtain a wafer 120. For example, the substrate 3 may have a thickness of approximately 500 µm, and the epitaxial layer 2 may have a thickness of approximately 10 µm. Then a mask layer 24, for example, of oxide with a thickness of approximately 500 nm, is first grown by thermal oxidation on the epitaxial layer 2 and then selectively removed where the anode region 14 is to be provided. In order to prevent, during the doping process, metal impurities from contaminating the epitaxial layer 2, a first protective layer 26, for example of oxide with a thickness of 50 nm, is grown on the epitaxial layer 2. A high-energy implantation of dopant ion species of a P+ type (represented by the arrows 27) is then performed so as to localize the dopant agents, for example boron atoms, in the epitaxial layer 2 underneath the first protective layer 26 to obtain the anode region 14, of a P+ type.

Then (FIG. 3), the mask layer 25 and the first protective layer 26 are removed by chemical wet etching. Wet etching, as compared to dry etching, may better prevent possible damages to the crystal lattice of the epitaxial layer 2 and enable reduction of undesirable contaminating particles being introduced in the epitaxial layer 2. A bottom dielectric layer 28, for example of oxide with a thickness comprised approximately between 100 nm and 300 nm, for example approximately 200 nm, is grown thermally above the epitaxial layer 2 and then selectively removed by chemical wet etching so as to delimit an opening 24 having an area wider than the area where the enriched region 16 is to be formed.

Figure 4:
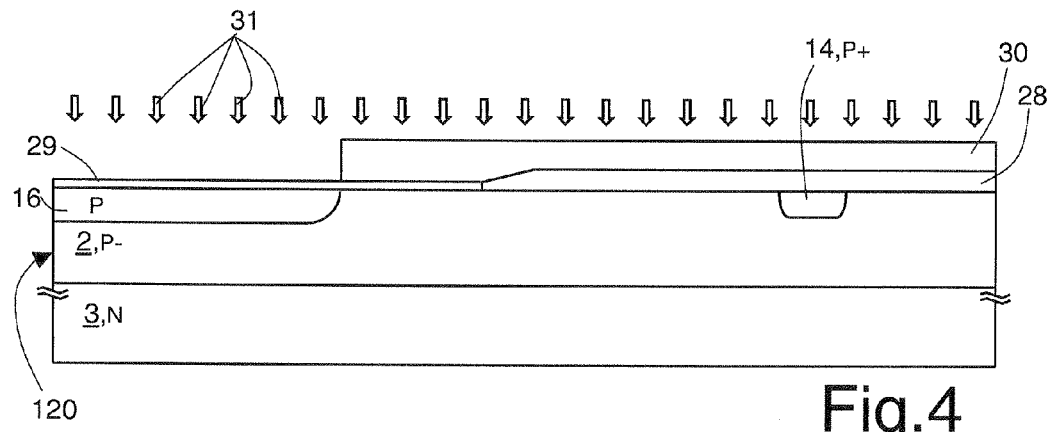
Figure 5:
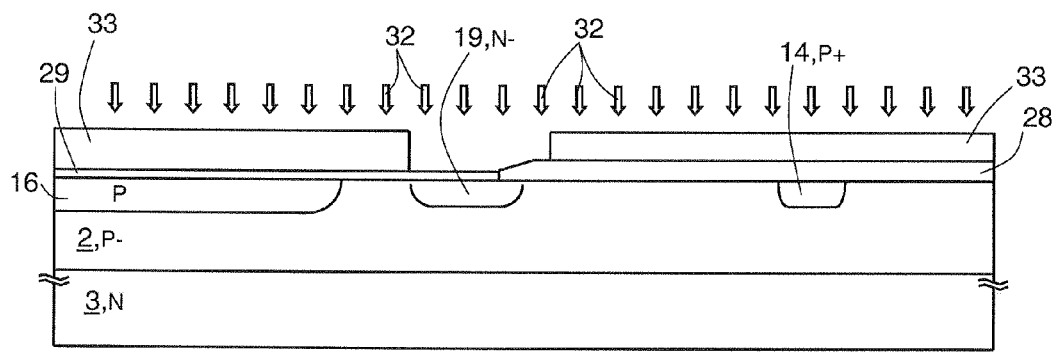
Figure 6:
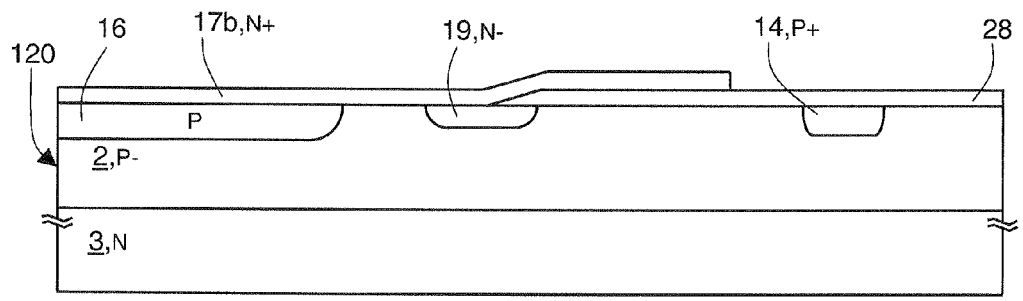
Figure 7:
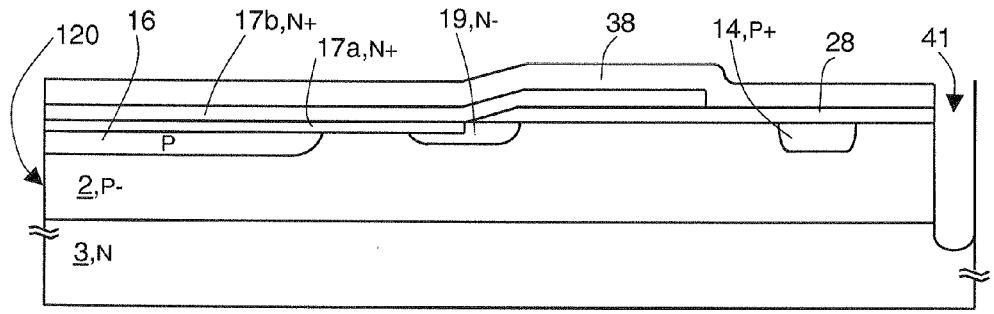
Figure 8:
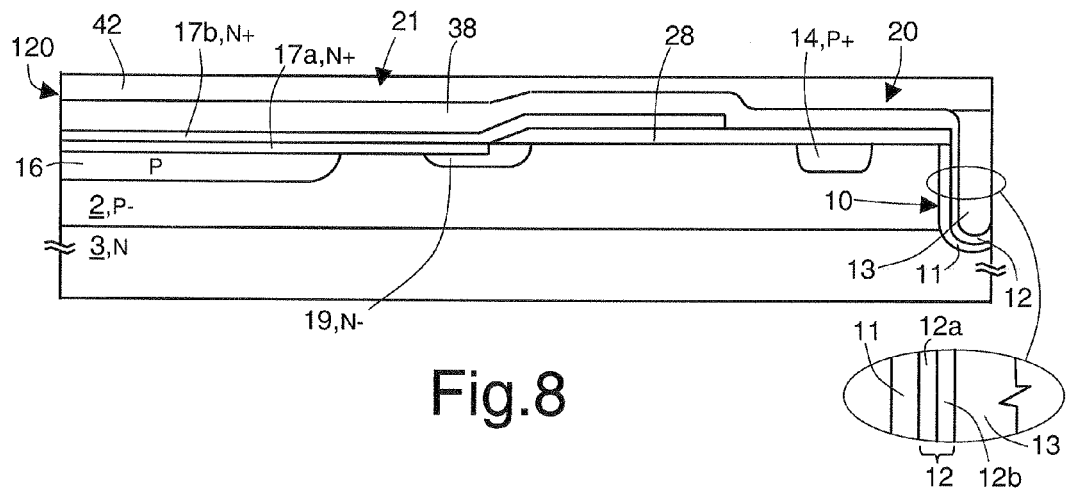
Figure 9:
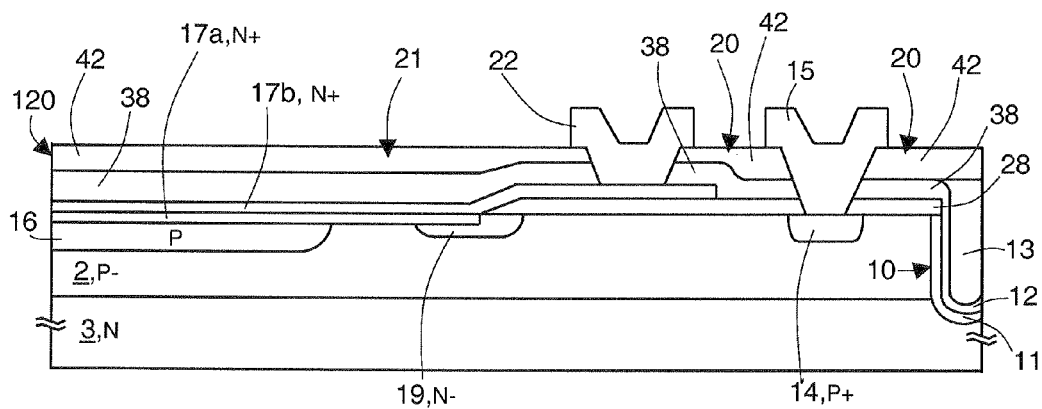

In FIG. 4, a second protective layer 29, for example of oxide with a thickness of approximately 25 nm, is grown on the epitaxial layer 2. Then a first resist mask 30 is laid on the wafer 120 so as to define precisely the region where the enriched region 16 is to be obtained. An implantation of dopant species of a P type (as indicated by the arrows 31) is then performed so as to form the enriched region 16.

Then (FIG. 5), the first resist mask 30 is removed, and a second resist mask 33 is laid on the wafer 120 so as to expose the region where the guard ring 19 is to be obtained. An implantation of dopant species of an N− type (indicated in FIG. 5 by the arrows 32) is then performed.

Next, the second resist mask 33 and the second protective layer 29 are removed, and a thermal annealing is performed, for example at the temperature of approximately 1150° C. for two hours, so as to reduce the sites of the epitaxial layer 2 that have been damaged because of the processes of ion implantation and dopant species activation, thus forming the guard ring 19. This operation moreover enables a breakdown voltage of the photodiode junction, for example, of approximately 25 V to be obtained.

Then (FIG. 6), a polycrystalline-silicon layer, with an N+ doping, for example with arsenic, and having a thickness, for example, comprised between approximately 50 and 200 nm, for example 100 nm, is deposited on the surface 2a of the wafer 120 and shaped so as to form the top cathode region 17b. In practice, the top cathode region 17b covers the portion of epitaxial layer 2 surrounded by the bottom dielectric layer 28 and the internal peripheral portion of the bottom dielectric layer 28, but leaves the rest of the bottom dielectric layer 28, in particular above the anode region 14, exposed.

Next (FIG. 7), intermediate dielectric layer 38, for example of TEOS, is deposited by CVD on the surface of the wafer 120. The intermediate dielectric layer 38, which forms part of the insulating region 21 and part of the insulation layer 20, is a passivating layer for the enriched region 16 and moreover has a protective function during the subsequent manufacturing steps. Then, a rapid thermal annealing is performed, for example, at approximately 1100° C., which causes the diffusion of dopant ion species, for example arsenic atoms, from the top cathode region 17b to the epitaxial layer 2, thereby forming the bottom cathode region 17a, of an N+ type. In this step, the intermediate dielectric layer 38 on the top cathode region 17b enables controlled diffusion of the dopant ion species, during the thermal-annealing step, towards the underlying epitaxial layer 2 and prevents its dispersion outside of the latter.

Next, the lateral insulation region 10 is provided. To this end, the wafer 120 is dry etched so as to form a trench 41, having, in top plan view, for example a circular or quadrangular shape, of a width comprised approximately between 1 and 3 µm, for example, approximately 1 µm, and a depth comprised approximately between 5 and 15 µm, for example, approximately 10 µm.

Next (FIG. 8), a pre-deposition of $POCl_3$ is performed on the sides and on the bottom of the trench 41 so as to form, by diffusion of phosphorus in the wafer 120, the channel-stopper region 11. The channel-stopper region 11 moreover forms a gettering layer for the impurities, in particular transition metals that could be present as impurities in the environment and facilities used during the described fabrication processes.

Next, the thin coating layer 12a is first grown on the internal edges and on the bottom of the trench 41, and has a thickness comprised between approximately 10 and 20 nm, for example approximately 15 nm; then, the thick coating layer 12b, having a thickness comprised between approximately 100 and 200 nm, for example approximately 100 nm, is deposited, for example by CVD. The thin coating layer 12a and the thick coating layer 12b form, has already mentioned, the coating region 12. The trench 41 is then filled with metal to form the mirror region 13, and the surface of the wafer 120 is coated with a top dielectric layer 42, for example of SOG TEOS oxide, which forms, on the top cathode region 17b, the insulating region 21 and elsewhere, with the bottom intermediate dielectric layers 28 and 38, the insulation layer 20.

Finally (FIG. 9), the bottom, intermediate, and top dielectric layers 28, 38, and 42 are locally removed by chemical wet etching so as to form the openings for the anode metal region 15 and the cathode metal region 22. In particular, the anode and cathode metal regions 15, 22 may be obtained by sputtering deposition, definition, and low-temperature sintering in a hydrogen atmosphere in order to passivate any possible dangling bonds at the interface between the oxide regions and the silicon regions.

Figure 10:
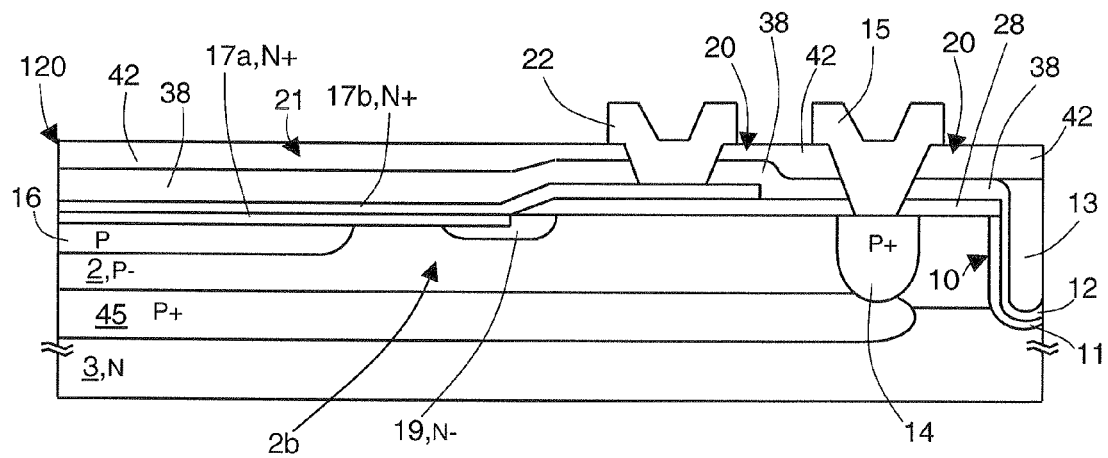
FIGS. 10-14 show cross-sections of variants of a photodiode belonging to the array of FIG. 1.

FIG. 10 shows a different embodiment in which, in order to prevent further electrical cross-talk, a buried region 45, with a P+ doping, is provided at the interface between the substrate 3 and the active area 2b. The buried region 45, which extends practically throughout the extension of the active area 2b, may be provided via implantation of dopant ion species of a P type in the substrate 3 before the growth of the epitaxial layer 2 and their activation and diffusion following growth of the epitaxial layer 2. In addition, the anode region 14 is made at a depth such as to extend as far as the buried layer 45 and be in direct electrical contact with the buried layer 45. This embodiment enables a further reduction in the adverse effect of electrical cross-talk in so far as the electrons, which are the most responsible for the electrical cross-talk, possess an extremely reduced lifetime within regions with P+ doping.

Figure 11:
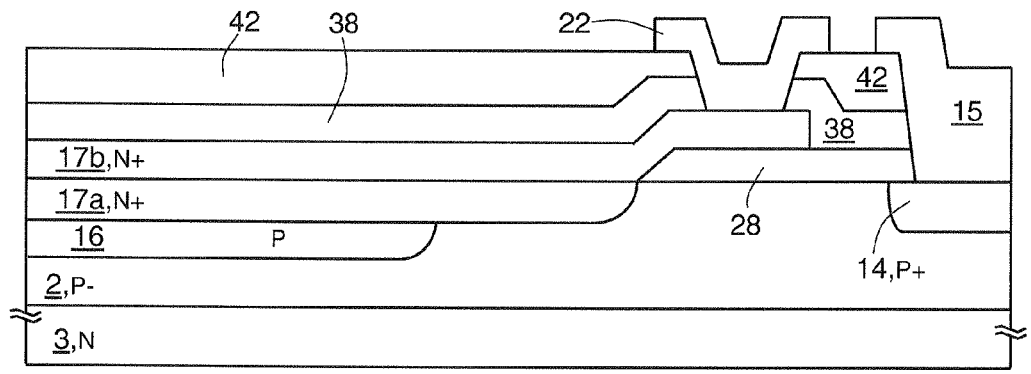

FIG. 11 shows an embodiment wherein the guard ring 19 is not present. This embodiment may be suitable, for example, when no problems of breakdown exist and the area of the photodiodes 1 is to be minimized.

Figure 12:
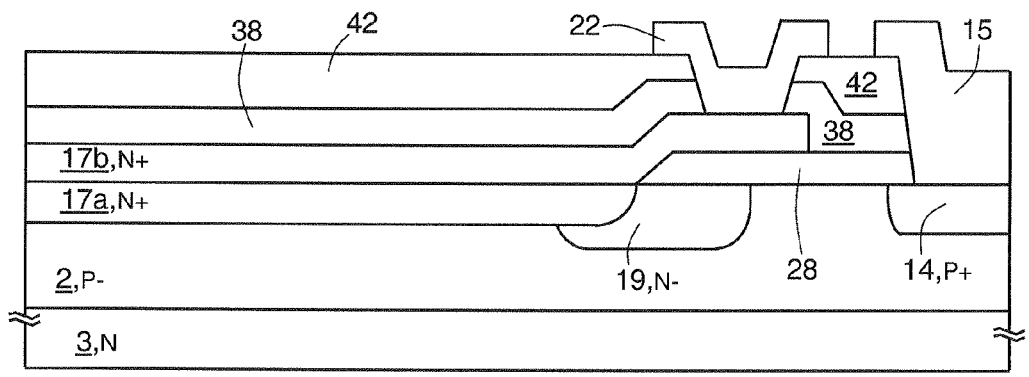

In FIG. 12, the enriched region 16 is, instead, absent. This embodiment may be advantageous for obtaining low-noise devices.

Figure 13:
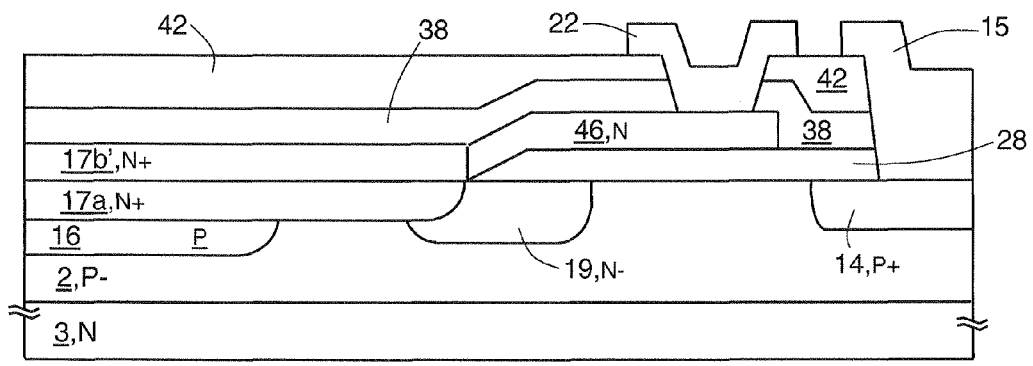

FIG. 13 shows an embodiment wherein the resistor for quenching and resetting the photodiode is provided in the same polycrystalline region that forms the top cathode region 17b, contiguously thereto. In detail, after deposition of the layer of polycrystalline silicon of an N type, which is to form the top cathode region 17b, a masked implantation of dopant ion species, once again of an N type, is performed in the polycrystalline-silicon layer and in particular in the central portion of the latter in direct contact with the bottom cathode region 17a. In this way, the polycrystalline region here comprises a first portion, referred to as top cathode region 17b' of an N+ type, which extends approximately only above the epitaxial layer 2 and is surrounded by the bottom dielectric layer 28, and a second portion, which forms a quenching resistor 46, of an N type. The top cathode region 17b' hence has a higher doping level than the quenching resistor 46.

Figure 14:
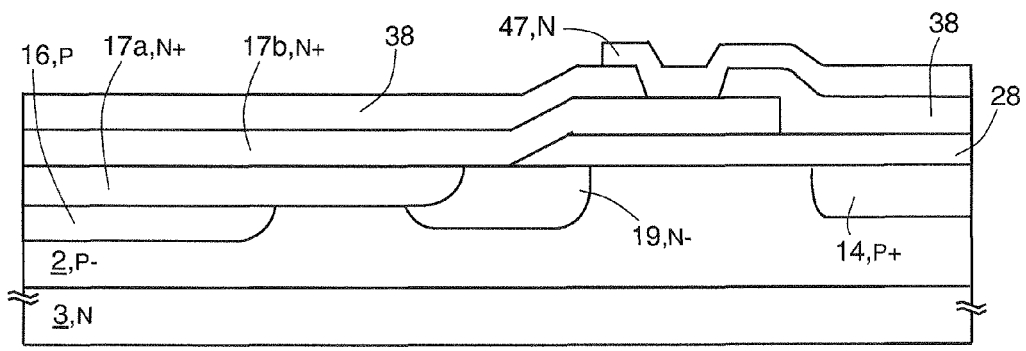

In FIG. 14, a quenching resistor 47 is, instead, formed from an appropriate polycrystalline region of an N type extending on top of the peripheral portion of top cathode region 17b and of the intermediate dielectric layer 38 and coupled in a way not illustrated to the cathode metal region 22.

Figure 15:
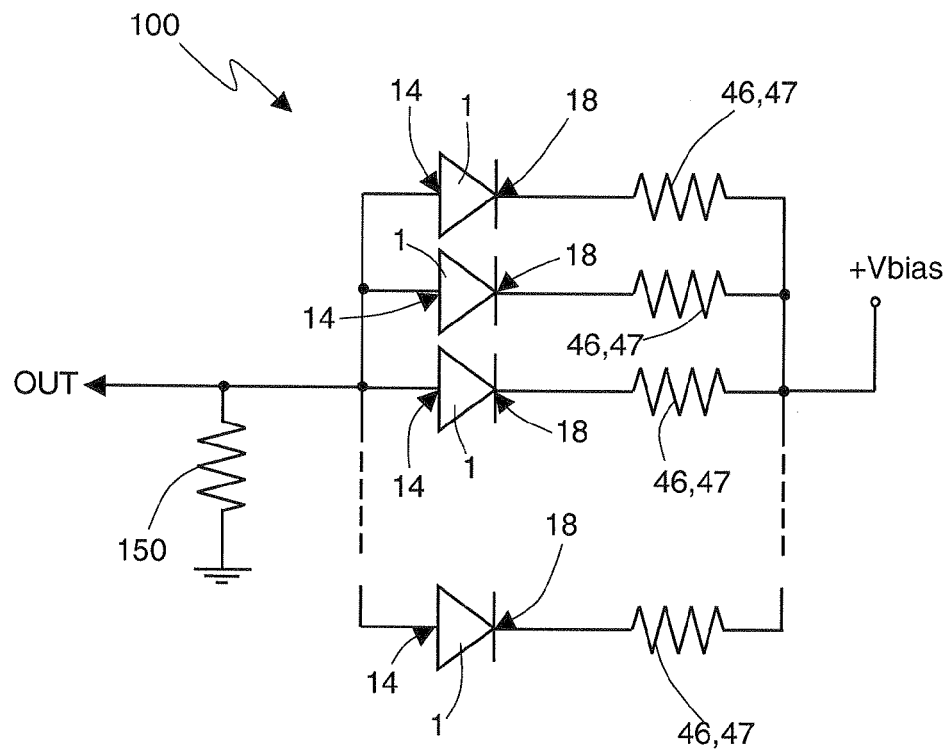
FIG. 15 shows an equivalent electrical representation of the array of FIG. 1.

FIG. 15 is an equivalent electrical representation of the array 100 of photodiodes 1 arranged in parallel to one another in order to increase the sensitivity. As may be noted, a quenching resistor 46, 47 is coupled in series to each photodiode 1, to the cathode contact 18 of the photodiode 1. The cathode terminal 18 of each photodiode 1 is biased at a positive voltage $V_{bias}$, for example of approximately 30 V, while the anode 14 of each photodiode 1 is grounded through a branch comprising a resistor 150, for example, of approximately 50Ω.

Figure 16:
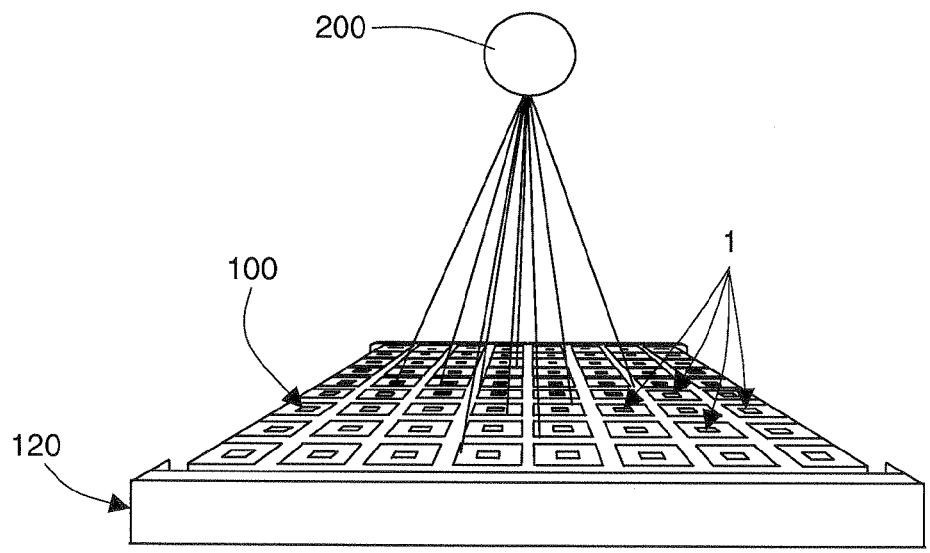
FIG. 16 is a schematic illustration of an array of FIG. 1 during use.

FIG. 16 shows an array 100 of photodiodes 1 in use, wherein a light source 200 illuminates a chip 120 on which the array 100 is integrated. In the embodiments shown, the photodiodes 1 form a matrix and are arranged in rows and columns.

Figure 17:
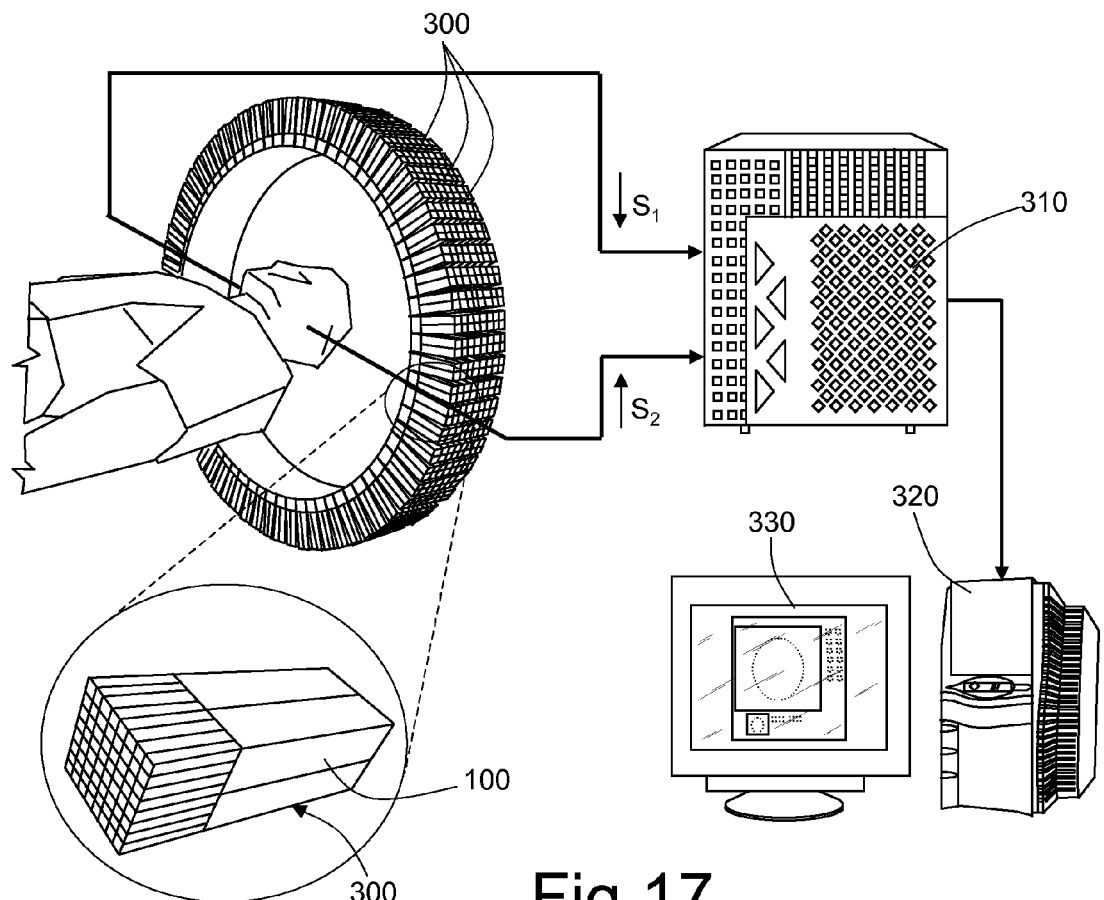
FIG. 17 shows an application of the array of FIG. 1.

An application of the array 100 of photodiodes 1 for obtaining images in the medical sector is shown in FIG. 17, together with an enlarged detail of a detector block 300. Each detector block 300 is formed by an array 100 of photodiodes 1. Here each photodiode 1 operates, independently of the other photodiodes 1, as detector of individual photons or packets of photons, generating an analog signal that is added to the signal generated by the other photodiodes 1 coupled in parallel, to produce an output signal $S_1$, $S_2$. In this way, each detector block 300 operates as a single photodetector with high quantum efficiency. The signals $S_1$, $S_2$ are then supplied to a coincidence processing unit 310, which yields the results of the processing operation through a processor 320, which enables display of the images detected on a display 330.

Figure 18:
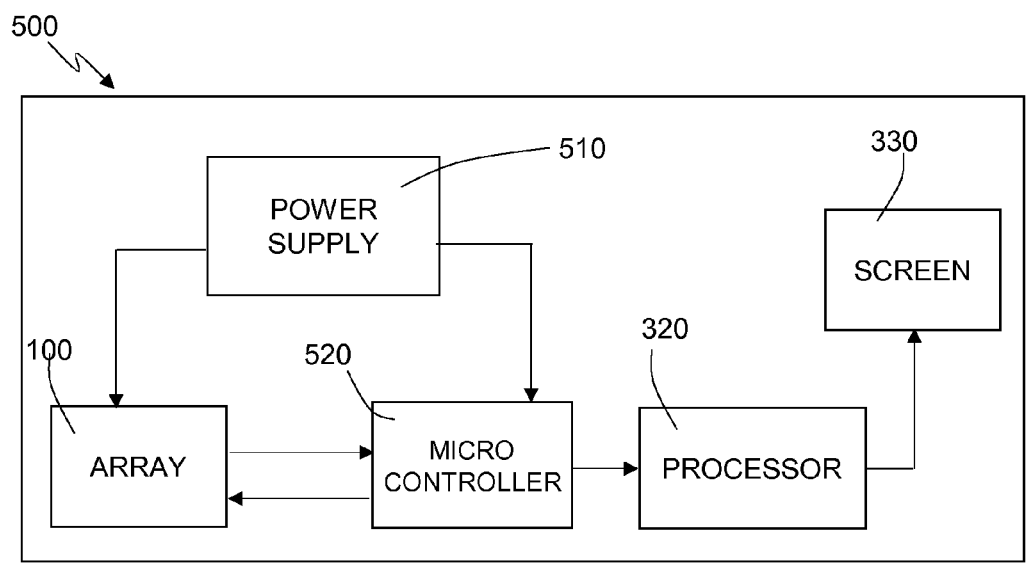
FIG. 18 shows a system that uses the array of FIG. 1.

Finally, the array 100 of photodiodes 1 may be used in a generic system 500 shown in FIG. 18, in which a power supply 510 supplies at least one array 100 of photodiodes 1 and at least one microcontroller 520 coupled to the array 100. The microcontroller 520 processes and supplies the detected lighting information to a processor 320, which enables display of the images detected on a display 330. In this way, it is possible to provide, for example, a positron-emission tomography system.

Finally, it is evident that modifications and variations may be made to the array of photodiodes described herein, without thereby departing from the scope of the present disclosure.

For example, the substrate 3 and the body 2 may be of an inverse conductivity type, and the position of the cathode region 18 and the anode region 14, as well as that of the respective electrodes, may be reversed. In addition, the insulation region 10 may also be provided before formation or in an intermediate step during formation of the regions 16, 17a, 19 in the epitaxial layer 2.

The array 100 of photodiodes 1 may be used moreover in the field of molecular biology, as a light sensor in fluorescence microscopes used for detection of fluorescence or luminescence phenomena of extremely low intensity.

Arrays 100 of photodiodes 1 may be used to provide sensors for photographic cameras and/or camcorders, in particular for digital capturing of three-dimensional images in conditions of poor lighting.

Naturally, in order to satisfy local and specific requirements, a person skilled in the art may apply to the solution described above many modifications and alterations. Particularly, although the present disclosure has been described with a certain degree of particularity with reference to described embodiment(s) thereof, it should be understood that various omissions, substitutions and changes in the form and details as well as other embodiments are possible. Moreover, it is expressly intended that specific elements and/or method steps described in connection with any disclosed embodiment may be incorporated in any other embodiment as a general matter of design choice.

What is claimed is:

1. A process for manufacturing an array of Geiger-mode avalanche photodiodes, comprising the steps of:
    forming a body of semiconductor material having a first conductivity type, and a surface;
    forming, inside said body and facing said surface, a first cathode region having the second conductivity type;
    forming inside said body and facing said surface, an anode region having the first conductivity type and a higher doping level than said body, said anode region extending laterally and at a distance from said first cathode region; and
    forming, inside said body, an insulation region comprising forming a mirror region of metal material, said insulation region extending through said body and surrounding an active area from the rest of the body, the active area housing the first cathode region and the anode region,
    wherein the step of forming said insulation region further comprises introducing dopant species of said second conductivity type around the mirror region so as to form a channel-stopper region surrounding said mirror region; and
    wherein the step of forming the channel-stopper region comprises depositing a dopant layer along the walls of said trench; and causing the dopant species of said second conductivity type to penetrate into the body.

2. The method according to claim 1, wherein the step of forming said insulation region comprises: forming a trench extending within the body; introducing said dopant species along walls of said trench so as to form the channel-stopper region; forming a coating region of dielectric material in contact with said channel-stopper region; and filling said trench with metal material so as to form said mirror region.

3. The method according to claim 2, wherein said dopant is a POCl₃ layer and the mirror region is of a material chosen from among aluminium, titanium, and tungsten.

4. A process for manufacturing an array of Geiger-mode avalanche photodiodes, comprising the steps of:
forming a body of semiconductor material having a first conductivity type, and a surface;
forming, inside said body and facing said surface, a first cathode region having the second conductivity type;
forming inside said body and facing said surface, an anode region having the first conductivity type and a higher doping level than said body, said anode region extending laterally and at a distance from said first cathode region; and
forming, inside said body, an insulation region comprising forming a mirror region of metal material, said insulation region extending through said body and surrounding an active area from the rest of the body, the active area housing the first cathode region and the anode region,
wherein the step of forming said insulation region further comprises introducing dopant species of said second conductivity type around the mirror region so as to form a channel-stopper region surrounding said mirror region;
the method further comprising the steps of forming a first dielectric layer on said surface of said body so as to cover a portion of said active area and delimit an opening overlying said active area; forming a polycrystalline region extending at least within said opening and transferring dopant ion species from the polycrystalline region to the active area so as to form said first cathode region underneath said opening.

5. The method according to claim 4, wherein forming said polycrystalline region comprises the steps of depositing a polysilicon layer having the second conductivity type; shaping said polysilicon layer so as to form a first portion within said opening and a second portion on said first dielectric layer; and introducing dopant ion species of the second conductivity type in the first portion so that the second portion has a higher resistivity than the first portion.

6. The method according to claim 4, comprising forming a second dielectric layer on said first dielectric layer and on said polycrystalline region; and then forming a resistive region on top of said first dielectric layer and said second dielectric layer and in electrical contact with said polycrystalline layer.

7. A process for manufacturing an array of Geiger-mode avalanche photodiodes, comprising the steps of:
forming a body of semiconductor material having a first conductivity type, and a surface;
forming, inside said body and facing said surface, a first cathode region having the second conductivity type;
forming inside said body and facing said surface, an anode region having the first conductivity type and a higher doping level than said body, said anode region extending laterally and at a distance from said first cathode region; and
forming, inside said body, an insulation region comprising forming a mirror region of metal material, said insulation region extending through said body and surrounding an active area from the rest of the body, the active area housing the first cathode region and the anode region,
wherein the step of forming said insulation region further comprises introducing dopant species of said second conductivity type around the mirror region so as to form a channel-stopper region surrounding said mirror region;
the method further comprising introducing dopant ion species of the first conductivity type into said active area underneath the first cathode region so as to form an enrichment region underneath and in direct contact with the first cathode region, said enrichment region having the first conductivity type and a higher doping level than said active area.

8. The method according to claim 1, comprising the step of introducing dopant ion species of the second conductivity type into said active area so as to form a guard region facing said surface laterally to and in direct contact with said first cathode region, said guard region having a lower doping level than said first cathode region.

9. The method according to claim 1, wherein forming a body comprises forming a buried region on top of a substrate of said second conductivity type, said buried region having the first conductivity type and a higher doping level than said body; growing an epitaxial layer of said first conductivity type on top of said substrate and said buried region; and introducing dopant elements of the first conductivity type into said active area so that said anode region is in contact with said buried region.

10. A method, comprising:
forming an anode adjacent to a surface of a semiconductor material;
forming a first portion of a cathode in the semiconductor material adjacent to the surface and remote from the anode;
forming in the semiconductor material between the anode and the cathode a body having a same conductivity as the anode;
forming a trench in the semiconductor material having a trench side wall doped with a conductivity opposite to the conductivity of the body; and
forming an isolator in the semiconductor material in the trench around the cathode and the anode having a mirror region made of metal material surrounded by a channel-stopper region.

11. The method of claim 10, further comprising forming a second portion of the cathode over and in contact with the first portion of the cathode.

12. A method, comprising:
forming an anode adjacent to a surface of a semiconductor material;
forming a first portion of a cathode in the semiconductor material adjacent to the surface and remote from the anode;
forming in the semiconductor material between the anode and the cathode a body having a same conductivity as the anode; and
forming an isolator in the semiconductor material around the cathode and the anode;
wherein forming the isolator comprises:
forming a trench in the semiconductor material adjacent to the body;
doping a wall of the trench to have a conductivity opposite to the conductivity of the body;
lining the wall of the trench with an insulator; and
forming a reflective material in the lined trench.

13. The method of claim 10, further comprising forming in the semiconductor material around and contiguous with the cathode a guard region having a same conductivity as the cathode.

14. The method of claim 10, further comprising forming in the semiconductor material contiguous with the cathode an enriched region having a same conductivity as and a higher doping concentration than the body.

15. The method of claim 10, further comprising forming in the semiconductor material contiguous with the anode a buried region having a same conductivity and approximately a same doping concentration as the anode.

16. The method of claim 10, further comprising forming a resistor over the semiconductor material in electrical communication with the first portion of the cathode.

* * * * *